United States Patent [19]

Slemmer

[11] Patent Number: 5,781,043
[45] Date of Patent: Jul. 14, 1998

[54] DIRECT CURRENT SUM BANDGAP VOLTAGE COMPARATOR

[75] Inventor: William Carl Slemmer, Dallas, Tex.

[73] Assignee: SGS-Thomson Microelectronics, Inc., Carrollton, Tex.

[21] Appl. No.: 932,930

[22] Filed: Sep. 18, 1997

Related U.S. Application Data

[63] Continuation of Ser. No. 606,233, Feb. 23, 1996, abandoned, which is a continuation of Ser. No. 56,301, Apr. 30, 1993, abandoned.

[51] Int. Cl.[6] ...................................................... H03K 5/22
[52] U.S. Cl. ...................... 327/78; 327/77; 327/361; 327/539; 327/541; 327/542; 327/543
[58] Field of Search .......................... 327/74, 77, 78, 327/530, 538, 540, 541, 543, 545, 546, 361, 539, 542

[56] References Cited

U.S. PATENT DOCUMENTS

| | | | |
|---|---|---|---|
| 4,473,758 | 9/1984 | Huntington | 327/537 |
| 4,556,804 | 12/1985 | Dewitt | 327/541 |
| 4,617,473 | 10/1986 | Bingham | 327/85 |
| 4,806,789 | 2/1989 | Sakihama et al. | 327/437 |
| 4,958,123 | 9/1990 | Hughes | 327/546 |
| 5,111,071 | 5/1992 | Kwan et al. | 327/77 |
| 5,272,393 | 12/1993 | Horiguchi et al. | 327/535 |
| 5,373,227 | 12/1994 | Keeth | 327/541 |

*Primary Examiner*—Terry Cunningham
*Attorney, Agent, or Firm*—Theodore E. Galanthay; Kenneth C. Hill; Lisa K. Jorgenson

[57] ABSTRACT

A direct current sum bandgap voltage comparator for detecting voltage changes in a power supply. The direct current sum bandgap voltage comparator includes a summing node, current sources connected to the summing node and the power supply, and an indicator circuit connected to the summing node. Each current source supplies a current to the summing node wherein the summing node voltage level is responsive to the currents supplied. The indicator circuit is responsive to changes in the summing node voltage level and generates at an output a logical signal at one state when the summing node voltage level is greater than a predetermined value and generates the logical signal at the output at another state when the summing node voltage level is less than the predetermined value, the predetermined value corresponding to a preselected power supply voltage.

23 Claims, 2 Drawing Sheets

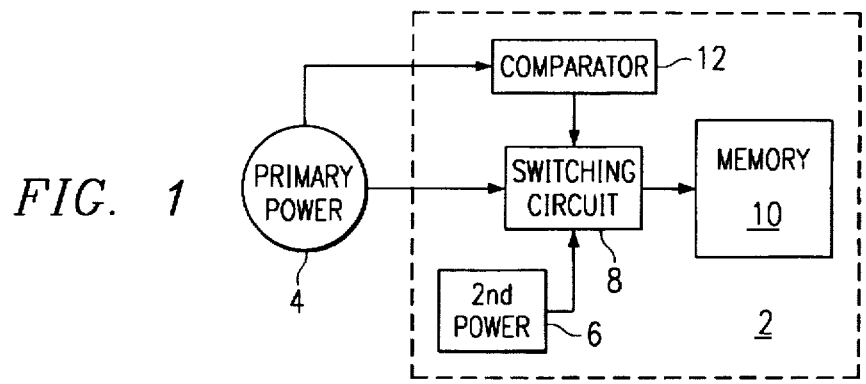
FIG. 1
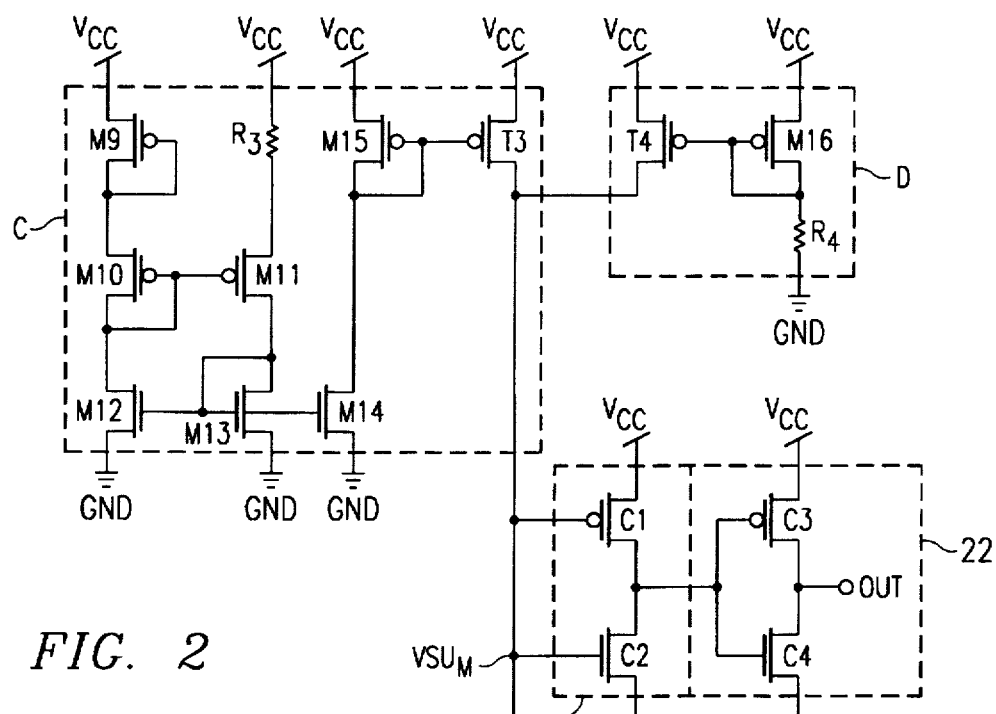
FIG. 2
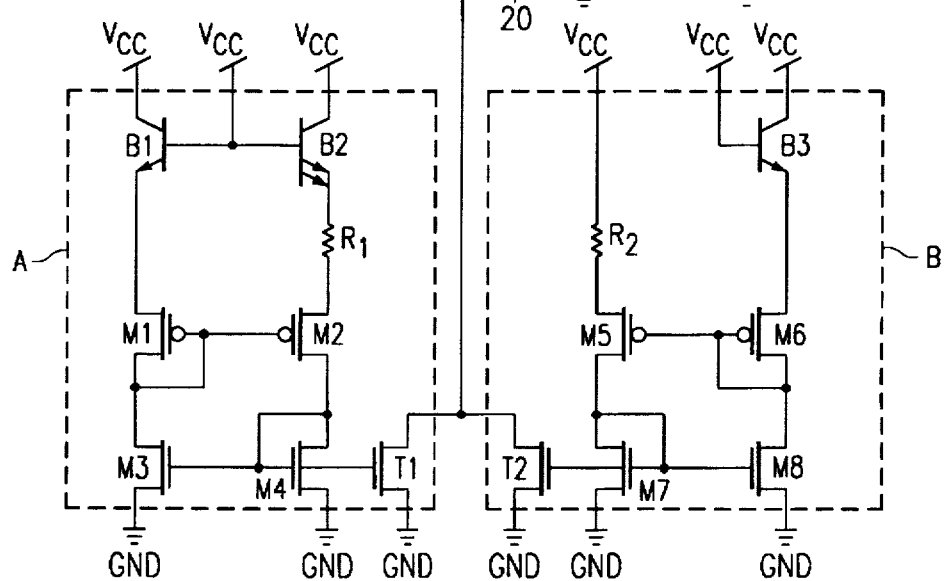

5,781,043

DIRECT CURRENT SUM BANDGAP VOLTAGE COMPARATOR

This is a Continuation of application Ser. No. 08/606,233, filed Feb. 23, 1996, now abandoned, which is a Continuation of application Ser. No. 08/056,301, filed Apr. 30, 1993, now abandoned.

BACKGROUND OF THE INVENTION

1. Field of the Invention

The present invention relates to integrated circuits and in particular to MOS integrated circuits. Still more particularly, the present invention relates to bandgap reference circuits in insulated gate FET semiconductor integrated circuits.

2. Description of the Prior Art

In some situations it is desirable to provide retention of data in integrated circuits such as memory devices. A number of circuits are commercially available for retaining data in SRAMS when power is removed. These devices are often known as "zero power circuits". Typically, in a zero power circuit, the contents of the circuit are protected in the event that the power supply voltage to that circuit drops below some predetermined or preselected threshold voltage. This protection may be accomplished by switching the circuit from the primary power supply to a secondary power supply, typically an integral battery, when the voltage of the primary power supply drops below the selected threshold voltage. Secondary or backup power supplies are well known, as may be seen in U.S. Pat. Nos. 4,381,458 and 4,645,943.

Power controller circuits exist, which provide automatic sensing of a primary power source voltage. These power controller circuits provide automatic switching to a secondary power source when the primary power source voltage drops below a predetermined threshold voltage. An example of one such system may be found in U.S. Pat. No. 5,121,359, which describes a programmable logic device with a backup power supply that is automatically provided when a power loss at an input pin is detected. U.S. Pat. No. 4,654,829 discloses a portable non-volatile memory module, using a comparator and switching circuitry to switch between a primary power supply and a secondary power supply, such as a battery power supply.

Past approaches in setting or selecting the voltage level in a zero power circuit has involved the use of many bipolar devices, large resistors, oscillators, switched capacitors, autozero devices, etc. A bandgap reference circuit is one circuit that may be used to set that voltage level. One drawback with a typical bandgap reference circuit is that a large number of devices are needed for implementation. As a result, a large amount of area on a semiconductor chip is required. In addition to the area problem, typical bandgap reference circuits also are fairly sensitive to noise within the circuit. For example, active memory circuits are usually noisy and known bandgap circuits used with active memories circuits are usually sensitive to the noise generated.

Therefore it would be desirable to have a circuit that is smaller, simpler, and less sensitive to noise.

SUMMARY OF THE INVENTION

The present invention provides a direct current sum bandgap voltage comparator for detecting voltage changes in a power supply. The direct current sum bandgap voltage comparator includes a summing node, current sources, and an indicator circuit. The current sources are connected to the summing node and each current source supplies a current to the summing node, wherein the voltage at the summing node is responsive to the current supplied to the summing node. The indicator circuit has an input connected to the summing node and generates a logical signal at an output that is responsive to voltage changes in the summing node.

The direct current sum bandgap voltage comparator may be used in a zero power circuit also including a circuit, in which power is to be maintained, and a switching circuit for providing power to the first circuit from a primary power supply and a secondary power supply. The switching circuit is connected to the output of the indicator circuit, wherein power from the primary power supply is supplied to the first circuit if the logical signal indicates that the power supply voltage is equal to or greater than the preselected voltage, and power from the secondary power supply is supplied to the first circuit if the power supply voltage is less than the preselected voltage.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 1 is a block diagram of a zero power circuit according to the present invention;

FIG. 2 is a schematic diagram of a direct current sum bandgap voltage comparator according to the present invention.

DESCRIPTION OF THE PREFERRED EMBODIMENT

Figure 3:
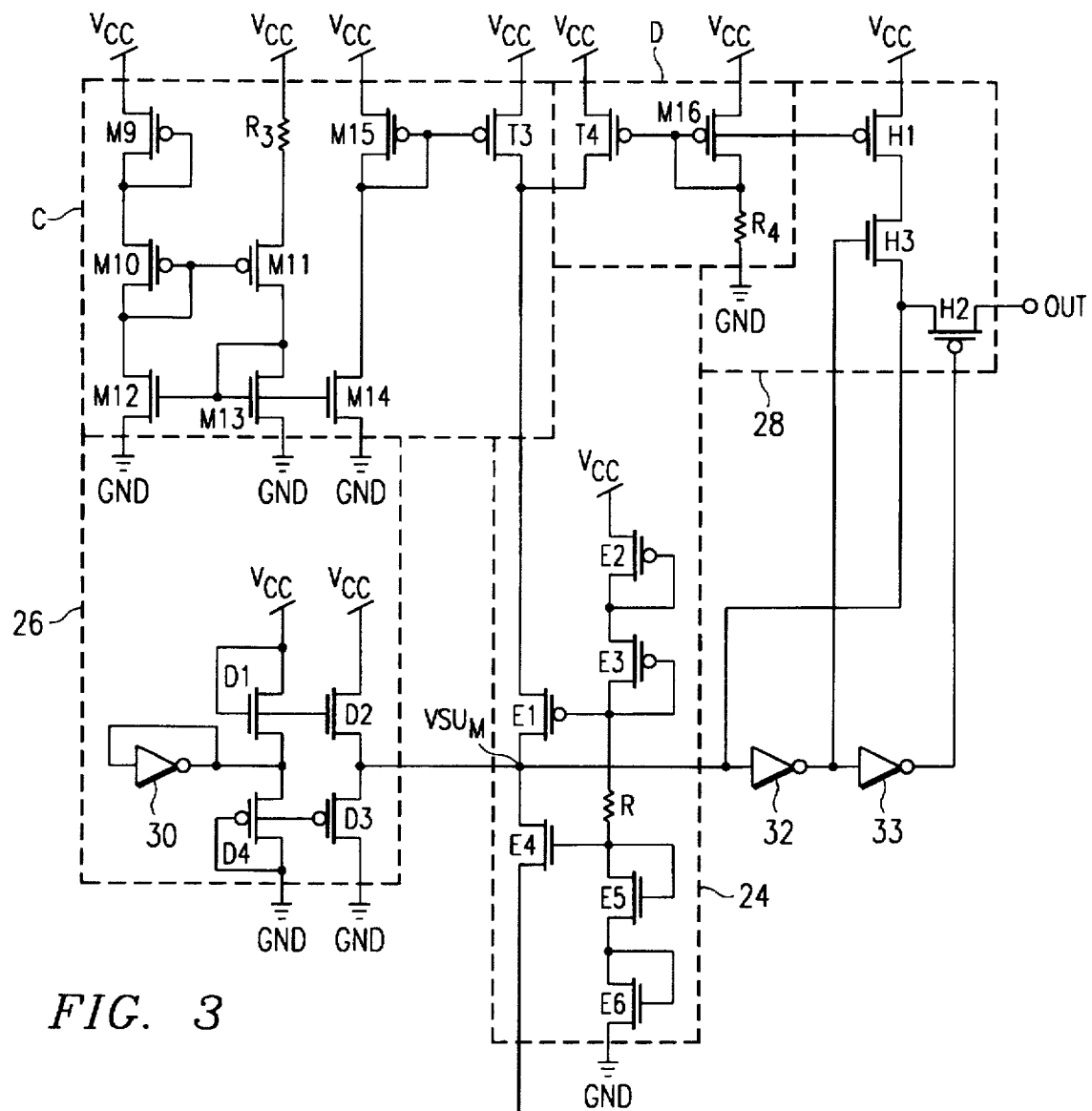
FIG. 3 is a schematic diagram of an alternative direct current sum bandgap voltage comparator according to the present invention.
Figure 3:
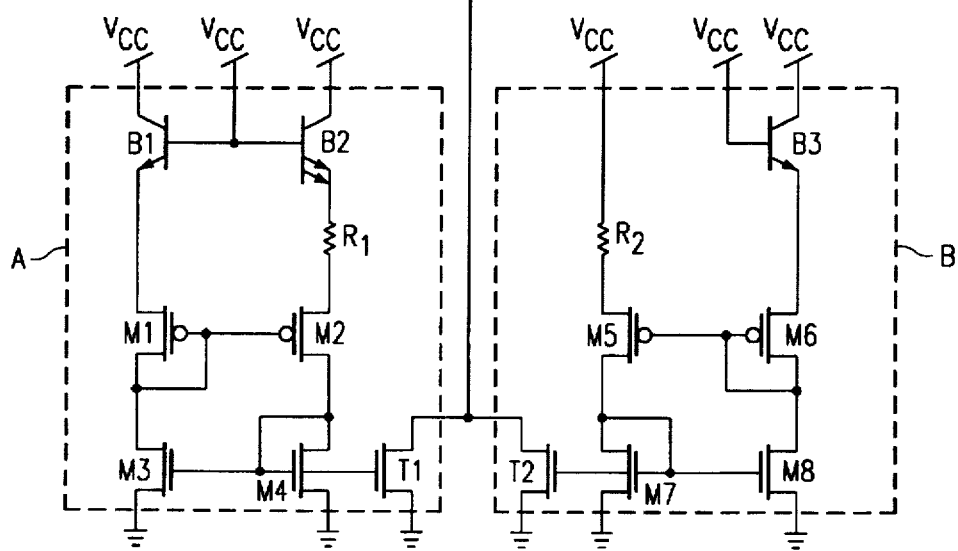

Referring now to FIG. 1, a block diagram of a zero power circuit 2 on a chip is illustrated. Zero power circuit 2 is connected to a primary power supply 4 and has a secondary power supply 6, located within an integral package. Secondary power supply 6 is typically a battery constructed in the plastic package housing the chip. Other secondary power supplies, such as, for example, a battery located outside the package may also be used.

Zero power circuit 2 includes a switching circuit 8, a memory 10, and a direct current sum bandgap voltage (DCSBV) comparator 12 constructed according to the present invention. Switching circuit 8 is connected to primary power supply 4 and secondary power supply 6. This circuit controls the power supplied to memory 10 and may include logic to provide for continuous supply of power to memory 10 during switching back and forth between primary power supply 4 and secondary power supply 6.

DCSBV comparator 12 has an input connected to primary power supply 4 and output connected to switching circuit 8. DCSBV comparator 12 has an output connected to switching circuit 8 to indicate when the primary power supply voltage is at or above a preselected voltage or drops below the preselected voltage.

Those of ordinary skill in the art will realize that the zero power circuit 2 may include additional circuits and that various circuits may be used in place of memory 10. Switching circuit 8 may be implemented with a number different designs known to those of ordinary skill in the art.

A DCSBV comparator may be constructed using four current sources each of which generates a current representing one of the terms of a bandgap equation:

$$K_1(V_{CC}-V_T)+K_1V_T=K_2V_{BE}+K_3(kT/q) \quad (1)$$

where $V_{CC}$ is the power supply voltage, $V_T$ is the absolute value of the threshold voltage, and $V_{BE}$ is the base emitter voltage. kT/q is equal to the thermal voltage, where k is Boltzman's constant, T is the temperature in kelvin, and q is the electronic charge. Voltages $(V_{CC}-V_T)$, $V_T$, $V_{BE}$, and kT/q are converted to currents in four current mirror circuits. Other equivalent forms of this equation may be implemented according to other embodiments of the present invention.

The four current sources may be provided using current mirrors A–D, as illustrated in the schematic diagram of a current sum bandgap voltage (DCSBV) comparator in FIG. 2. Current mirror A generates a current:

$$I_A \propto \frac{kT}{q} \frac{1}{R_1} \quad (2)$$

Current mirror B generates a current:

$$I_B \propto \frac{V_{BE}}{q} \frac{1}{R_2} \quad (3)$$

Current mirror C generates a current:

$$I_C \propto V_T \frac{1}{R_3} \quad (4)$$

while current mirror D generates a current:

$$I_D \propto (V_{CC}-V_T) \frac{1}{R_4} \quad (5)$$

The constants $K_1$–$K_3$ from equation (1) may be set by resistors and scaled transistors in the current mirrors.

The currents contributed by each of the current mirrors, A–D, are summed at a summing node, referred to as node VSUM. The node will swing to the edge of saturation corresponding to the mirror or current mirrors supplying the larger current or currents. Node VSUM is connected to two complementary metal-oxide semiconductor (CMOS) inverters 20 and 22 formed by transistors C1–C4, where transistors C1 and C3 are p-channel metal-oxide semiconductor field effect transistors (MOSFETs) and transistors C2 and C4 are n-channel MOSFETs. Inverters 20 and 22 are used as detectors for node VSUM and provide for a rail-to-rail voltage swing at output 24 of the DCSBV comparator.

Current mirror circuit A is constructed from sized transistors M1–M4, T1, B1, and B2 and resistor $R_1$. Transistors M1–M4, and T1 are MOSFETs. Transistors M1 and M2 are p-channel MOSFETs, while transistors M3, M4, and T1 are n-channel MOSFETs. Transistors B1 and B2 are bipolar junction transistors. The collectors and bases of transistors B1 and B2 are connected to power supply voltage $V_{CC}$; the sources of transistors M3 and M4 are connected to power supply voltage GND, which is connected to ground. Resistor $R_1$ has a one end connected to the emitter of transistor B2 and the other end connected to the source of transistor M2.

Transistors M1–M4, T1, B1, and B2 are sized transistors and are employed to obtain different current densities in different parts of current mirror circuit A. Transistors M1 and M3 are sized to provide a current flow that is ten times the current generated by transistors M2 and M4. The emitter area of transistor B2 is twice that of transistors B1. The voltage across resistor $R_1$ provides a current. The sizing of the transistors and the resistor $R_1$ is selected to generate a current of:

$$I = \frac{kT}{qR_1} \ln\left(\frac{J_1}{J_2}\right) \quad (6)$$

through transistor M4, where $J_1$ is the current density of transistor B1 and $J_2$ is the current density of transistor B2.

Transistor T1 is designed to generate a current that is N times the current flowing through transistor M4. As a result, the current contributed by current mirror A is:

$$I_A = \frac{NkT}{q\rho_s r_1} \ln\left(\frac{J_1}{J_2}\right) \quad (7)$$

where $R_1$ has been replaced by sheet resistance $\rho_s$ and the number of squares $r_1$. In the preferred embodiment, the sheet resistance $\rho_s$ for all of the resistors in the circuit will be the same. Therefore, the constant $K_3$ in equation (1) is as follows:

$$K_3 = \frac{N}{r_1} \ln\left(\frac{J_1}{J_2}\right) \quad (8)$$

By scaling the current in the left and right legs of current mirror A, the need for a large number of bipolar structures (i.e., 30 or more) is eliminated.

Current mirror circuit B includes transistors M5–M8, transistor B3, and resistor $R_2$. Transistors M5 and M6 are p-channel MOSFETs, while transistors M7 and M8 are n-channel MOSFETs. Transistor B3 is a bipolar junction transistor.

Resistor $R_2$ has one end connected to the drain of transistor M5 and a second end connected to power supply voltage $V_{CC}$. The base and collector of transistor B3 also are connected to power supply voltage $V_{CC}$, while the sources of transistors M7 and M8 are connected to power supply voltage GND.

Transistors M5–M8 and T2 are sized MOSFETs. Transistors M6 and M8 are scaled to generate a current flow that is one tenth of the current flowing through transistors M5 and M7. The current flowing through transistors M5 and M7 is equal to the current flowing through transistors M2 and M4 in current mirror A. Transistor T2 is constructed to provide a current flow that is M times the current flowing through transistor M7. The voltage $V_{BE}$ is set up by transistor B3 (that is, $V_{BE}$ is the base-emitter voltage of transistor B3), and resistor $R_2$ sets up the current; the voltage drop across $R_2$ is $V_{BE}$. As a result, current mirror B generates a current:

$$I_B = \frac{MV_{BE}}{\rho_s r_2} \quad (9)$$

where $\rho_s$ is the sheet resistance of resistor $R_2$ and $r_2$ is the number of squares in resistor $R_2$. The constant $K_2$ from equation (1) is defined as:

$$K_2 = \frac{M}{r_2} \quad (10)$$

Next, current mirror C includes transistors M9–M15, and T3 and resistor $R_3$. Resistor $R_3$ has one end connected to the source of transistor M11 and another end connected to power supply voltage $V_{CC}$. Transistor M9 has its source connected to power supply voltage $V_{CC}$, while the sources of transistors M12, M13, and M14 are connected to ground power supply voltage GND. The voltage $V_T$ is set up by transistor M9 (that is, $V_T$ is the absolute value of the threshold voltage of transistor M9), while resistor $R_3$ sets up the current. The voltage drop across $R_3$ is $V_T$.

Transistors M9–M11, M15, and T3 are p-channel MOSFETS, while transistors M12–M14 are n-channel MOSFETs. These transistors are sized transistors. The current flowing through transistors M11 and M13 is the same as the current flowing through transistors M14 and M15. The current flowing through transistors M11 and M13–M15 is the same as the current flowing through transistor M5 and M7 in current mirror B. Transistors M9, M10, and M12 are sized to provide a current flow that is one tenth of the current flowing through transistors, M11, M13, M14, and M15. Transistor T3 is designed to provide a current flow that is L times the current flowing through transistor M14. Thus, current mirror C generates a current:

$$I_C = \frac{LV_T}{\rho_s r_3} \qquad (11)$$

where $\rho$ is the sheet resistance of resistor $R_3$ and $r_3$ is the number of squares in resistor $R_3$. The coefficient $K_1$ in equation (1) is defined as:

$$K_1 = \frac{L}{r_3} \qquad (12)$$

for current mirror C.

Current mirror D includes transistor M16, transistor T4, and resistor $R_4$. Both transistors M16 and T4 are p-channel MOSFETs with their sources connected power supply voltage $V_{CC}$. Resistor $R_4$ has one end connected to the drain of transistor M16 and a second end connected to power supply voltage GND. Transistor M16 sets up the voltage $V_{CC}-V_T$, while resistor $R_4$ sets up the current. The voltage drop across $R_4$ is $V_{CC}-V_T$.

Transistors M16 and T4 are scaled transistors. Transistor M16 is designed to provide a current flow that is equal to the current flowing through transistors M14 and M15; transistor T4 is constructed to generate a current that is J times the current flowing through transistor M16. Thus, the current generated by current mirror D is:

$$I_D = \frac{(VCC - V_T)J}{\rho_s r_4} \qquad (13)$$

where the coefficient $K_1$ in the current mirror is set as:

$$K_1 = \frac{J}{r_4} \qquad (14)$$

Since both current mirrors C and D create current contributions that are related to the coefficient $K_1$, the current mirrors must be sized according to the following relationship:

$$\frac{J}{r_4} = \frac{L}{r_3} \qquad (15)$$

As a result, the voltage level of node VSUM is set by the selection of the sizes and properties of the devices involved in constants $K_1$–$K_3$. The voltage at node OUT is set to $V_{CC}/2$ in the depicted circuit when the voltage at VSUM is equal to $V_{CC}/2$, and the power supply voltage $V_{CC}$ is equal to the selected or threshold voltage. If the current from transistors T1 and T2 is less than the current from transistors T3 and T4, the voltage at node OUT will swing up to that of power supply voltage $V_{CC}$. This situation occurs when the power supply voltage $V_{CC}$ is greater than the selected voltage. On the other hand, if the current from transistors T1 and T2 is greater than the current from transistors T3 and T4, the voltage at node OUT will swing down to that of power supply voltage GND. This situation occurs when the power supply voltage $V_{CC}$ is less than the selected or threshold voltage.

The threshold voltage may be set at a value slightly less than the desired power supply voltage according to the present invention. For example, in a five volt power supply system, the threshold voltage may be set at 4.8 volts such that when the power supply is at 5 volts, the output at node OUT will swing up to power supply voltage $V_{CC}$, 5 volts. If the power supply voltage drops below 4.8 volts, the output node OUT will swing down to the ground power supply voltage. Thus, through the selection of constants $K_1$–$K_3$, a voltage may be selected, wherein fluctuations of the power supply voltage $V_{CC}$ below the selected voltage will cause the comparator to indicate that a secondary or backup power supply should be switched to the circuit associated with the comparator.

The MOSFETs used in the current mirrors in the depicted circuit may have longer channels than the base technology. For example, in a 0.8 micron device, the transistors used in the current mirrors may have channel lengths from 3 to 6 microns. These longer channels may be used improve the precision of the current supplied by the current mirrors.

The scaling of currents in current mirrors A–D may be done in a variety of ways. In accordance with a preferred embodiment of the present invention, one of the transistors is selected as unity. A transistor that is to provide a current N times the current of the unity transistor is replaced with N unity transistors connected in parallel. Those of ordinary skill in the art will realize other methods of scaling currents may be employed.

Next, the value of the resistors must match preset ratios when specified, but the actual magnitude of the resistors affects only the power consumption of the circuit.

Current mirrors A–D in FIG. 1 are an example of one layout of a DCSBV comparator in accordance with a preferred embodiment of the present invention. Other configurations for the current mirrors will be apparent to those of ordinary skill in the art. Other numbers of current mirror layouts may be employed to satisfy equation (1).

Referring next to FIG. 3, a schematic diagram of a DCSBV comparator is illustrated. This comparator is similar to the comparator depicted in FIG. 1 with a few additional circuits. Drain impedance of the current sources may limit the voltage swing in some cases in which the current is limited to low or small changes. Additionally, small current changes may have problems in driving the node capacitance at node VSUM, resulting in a slow response.

To solve these problems, a cascode stage 24, well known to those of ordinary skill in the art, may be added the DCSBV comparator between the current sources and node VSUM, as depicted in FIG. 2, to improve the switching speed of the circuit. Cascode stage 24 includes transistors E1–E6 and resistor $R_r$. Transistors E1–E3 are p-channel MOSFETs, while transistors E4–E6 are n-channel MOSFETs. Transistor E2 has its source connected to power supply voltage $V_{CC}$, while transistor E6 has its source connected to power supply voltage GND. Transistor E1 has its source connected to the drains of transistors T3 and T4; transistor E4 has its source connected to the drains of transistor T1 and T2. Transistors E1 and E4 have their drains connected to node VSUM.

In some instances, a selected voltage swing having a range other than that between the power supply voltage $V_{CC}$ and power supply voltage GND may be desired. A clamping circuit 26, well known to those of ordinary skill in the art, may be added to provide a bias to set the voltage swing at node VSUM between selected or preset voltages. Clamping circuit 26 includes transistors D1–D4 and inverter 30. Transistors D1 and D2 are n-channel MOSFETs, while transistors D3 and D4 are p-channel MOSFETs. Transistors D1 and D2 have their drains connected to power supply voltage $V_{CC}$; transistors D3 and D4 have their drains connected to ground power supply voltage GND. The sources of transistors D2 and D3 are connected to node VBUM. Other clamping circuits other than the one depicted also may be used with the comparator of the present invention.

In addition, a hysteresis circuit 28, known to those of ordinary skill in the art, may be used to reduce the susceptibility of the comparator to noise from other components. Hysteresis circuit 28 includes transistors H1–H3. Transistors H1 and H2 are p-channel MOSFETs, and transistor H3 is an n-channel MOSFET. Transistor H1 has its source connected to power supply voltage $V_{CC}$. The gate of transistor H1 is connected to the gate and source of transistor M16. The gate of transistor H2 is controlled by the output of inverter 34; the gate of transistor H3 is controlled by the output of inverter 32. Inverters 32 and 33 are the same as inverters 10 and 12.

As a result, a DCSBV comparator provides an indicator for switching between a primary and secondary power supply without requiring a large number of devices for implementation as compared to a typical bandgap reference circuit. The present invention eliminates the need for using a large number of bipolar devices, large resistors, oscillators, switch capacitors, auto zero devices, etc. Through the use of current mirrors, the number of bipolar devices required are reduced. Additionally, sensitivity to noise also may be reduced by using a DCSBV comparator according to the present invention.

Although the depicted embodiment employs for current mirrors, other numbers of current mirrors and current mirrors of other designs may be used as long as the implementation of the current mirrors performs the function of summing currents at a node. Additionally, more than one node may be used for summing currents.

An example of typical values which can be used to fabricate an operational device are as follows. These numbers assume a typical processing technology, and a desired trip point for the comparator of approximately 4.4 volts. The constants $K_1$, $K_2$, and $K_3$, respectively, can be set to the values 2, 7, and 46 by proper selection of the various components and transistor sizes. Transistor design to give current densities of $J_1 = 1.0$ A/cm$^2$ and $J_2 = 0.05$ A/cm$^2$ provides for operation as described above.

While the invention has been particularly shown and described with reference to a preferred embodiment, it will be understood by those skilled in the art that various changes in form and detail may be made therein without departing from the spirit and scope of the invention.

What is claimed is:

1. A direct current sum bandgap voltage comparator comprising:

a summing node;

a plurality of current sources connected to the summing node, each current source further comprising at least one transistor, and each current source supplying a current to the summing node and being connected to a power supply voltage, wherein the currents sources supply currents according to a bandgap equation:

$$K_1(V_{CC} - V_T) + K_1 V_T = K_2 V_{BE} + K_3(kT/q)$$

where $V_{CC}$ is the power supply voltage, $V_T$ is a predetermined threshold voltage of a transistor in a first current source within the plurality of current sources, $V_{BE}$ is a base emitter voltage of a transistor in a second current source within the plurality of current sources, k is Boltzman's constant, T is a temperature in kelvin of a transistor in a third current source within the plurality of current sources, q is an electronic charge constant, and $K_1$, $K_2$, and $K_3$ are constants determined by a resistance and a transistor length in the first, second, and third current sources, respectively; and an indicator circuit having an input connected to the summing node and generating a logical signal at an output, responsive to voltage changes in the summing node.

2. The direct current sum bandgap voltage comparator of claim 1, wherein the plurality of current sources are current mirrors.

3. A direct current sum bandgap voltage comparator comprising:

a summing node;

a plurality of current sources connected to the summing node, each current source further comprising at least one transistor, and each current source supplying a current to the summing node and being connected to a power supply voltage; and an indicator circuit having an input connected to the summing node and generating a logical signal at an output, responsive to voltage changes in the summing node, wherein the currents sources supply currents according to a bandgap equation:

$$K_1(V_{CC} - V_T) + K_1 V_T = K_2 V_{BE} + K_3(kT/q)$$

where $V_{CC}$ is the power supply voltage, $V_T$ is a predetermined threshold voltage of a transistor in a first current source within the plurality of current sources, $V_{BE}$ is a base emitter voltage of a transistor in a second current source within the plurality of current sources, k is Boltzman's constant, T is a temperature in kelvin of a transistor in a third current source within the plurality of current sources, q is an electronic charge constant, and $K_1$, $K_2$, and $K_3$ are constants determined by a resistance and a transistor length in the first, second, and third current sources, respectively, and wherein the plurality of current sources comprises four current mirrors.

4. The direct current sum bandgap voltage comparator of claim 3, wherein the first current mirror includes a plurality of transistors and supplies a current to the summing node defined by $K_1(V_{CC} - V_T)$.

5. The direct current sum bandgap voltage comparator of claim 4, wherein the second current mirror includes a plurality of transistors and supplies a current to the summing node defined by $K_1 V_T$.

6. The direct current sum bandgap voltage comparator of claim 5, wherein the third current mirror includes a plurality of transistors and supplies a current to the summing node defined by $K_2 V_{BE}$.

7. The direct current sum bandgap voltage comparator of claim 6, wherein the fourth current mirror supplies a current to the summing node defined by $K_3(kT/q)$.

8. The direct current sum bandgap voltage comparator of claim 7 further comprising a clamping circuit connected to the summing node, wherein a voltage swing for the summing node, responsive to changes in current supplied by the current mirrors, may be set between predetermined voltages.

9. The direct current sum bandgap voltage comparator of claim 7 further comprising a cascode stage having at least a first and second connections, the first connection is connected to the summing node and the second connection is connected to one of the four current mirrors.

10. The direct current sum bandgap voltage comparator of claim 7 further comprising a hysteresis circuit connected to the indicator circuit to reduce noise.

11. The direct current sum bandgap voltage comparator of claim 7, wherein the indicator circuit includes a pair of inverters connected in series, wherein an input in the first inverter is the input of the indicator circuit connected to the summing node and an output of the second inverter is the output of the indicator circuit.

12. The direct current sum bandgap voltage comparator of claim 11, wherein the indicator circuit provides a logic one output if the power supply is equal to or greater than a preselected voltage.

13. A zero power circuit comprising:
a first circuit;
a direct current sum bandgap voltage comparator comprising:
   a summing node;
   a plurality of current sources connected to the summing node, each current source further comprising at least one transistor, and each current source supplying a current to the summing node and being connected to a power supply voltage, wherein the current sources supply according to a bandgap equation:

$$K_1(V_{CC}-V_T)+K_1V_T=K_2V_{BE}+K_3(kT/q)$$

where $V_{CC}$ is the power supply voltage, $V_T$ is a predetermined threshold voltage of a transistor in a first current source within the plurality of current sources, $V_{BE}$ is a base emitter voltage of a transistor in a second current source within the plurality of current sources, k is Boltzman's constant, T is a temperature in kelvin of a transistor in a third current source within the plurality of current sources, q is an electronic charge constant, and $K_1$, $K_2$, and $K_3$ are constants determined by a resistance and a transistor length in the first, second, and third current sources, respectively;
   an indicator circuit having an input connected to the summing node and generating a logical signal at an output, responsive to changes in the summing node; and
   a switching circuit for providing power to the first circuit from a primary power supply and a secondary power supply, the switching circuit being connected to the output of the indicator circuit, wherein power from the primary power supply is supplied to the first circuit if the logical signal indicates that the power supply voltage is equal to or greater than the predetermined threshold voltage and power from the secondary power supply is supplied to the first circuit if the power supply voltage is less than the predetermined threshold voltage.

14. A zero power circuit comprising:
a first circuit;
a direct current sum bandgap voltage comparator comprising:
   a summing node;
   a plurality of current sources connected to the summing node, each current source further comprising at least one transistor, and each current source supplying a current to the summing node and being connected to a power supply voltage;
   an indicator circuit having an input connected to the summing node and generating a logical signal at an output, responsive to changes in the summing node; and
   a switching circuit for providing power to the first circuit from a primary power supply and a secondary power supply, the switching circuit being connected to the output of the indicator circuit, wherein power from the primary power supply is supplied to the first circuit if the logical signal indicates that the power supply voltage is equal to or greater than the preselected voltage and power from the secondary power supply is supplied to the first circuit if the power supply voltage is less than the preselected voltage, wherein the current sources supply according to a bandgap equation:

$$K_1(V_{CC}-V_T)+K_1V_T=K_2V_{BE}+K_3(kT/q)$$

where $V_{CC}$ is the power supply voltage, $V_T$ is a predetermined threshold voltage of a transistor in a first current source within the plurality of current sources, $V_{BE}$ is a base emitter voltage of a transistor in a second current source within the plurality of current sources, k is Boltzman's constant, T is a temperature in kelvin of a transistor in a third current source within the plurality of current sources, q is an electronic charge constant, and $K_1$, $K_2$, and $K_3$ are constants determined by a resistance and a transistor length in the first, second, and third current sources, respectively, and wherein the plurality of current sources comprises four current mirrors.

15. The zero power circuit of claim 14, wherein the secondary power supply is a battery.

16. The zero power circuit of claim 14, wherein the first current mirror includes a plurality of transistors and supplies a current to the summing node defined by $K_1(V_{CC}-V_T)$.

17. The zero power circuit of claim 14, wherein the second current mirror includes a plurality of transistors and supplies a current to the summing node defined by $K_1V_T$.

18. The zero power circuit of claim 17, wherein the third current mirror includes a plurality of transistors and supplies a current to the summing node defined by $K_2V_{BE}$.

19. The zero power circuit of claim 18, wherein the fourth current mirror supplies a current to the summing node defined by $K_3(kT/q)$.

20. The zero power circuit of claim 19 further comprising a clamping circuit connected to the summing node, wherein a voltage swing for the summing node, responsive to changes in current supplied by the current mirrors, may be set between selected voltages.

21. The zero power circuit of claim 19 further comprising a cascode stage located between the summing node and the current mirrors.

22. The zero power circuit of claim 19 further comprising a hysteresis circuit connected to the indicator circuit to reduce noise.

23. The direct current sum bandgap voltage comparator of claim 19, wherein the indicator circuit provides a logic one output if the power supply is equal to or greater than a preselected voltage.

* * * * *